United States Patent
Seo et al.

(10) Patent No.: US 11,135,752 B2
(45) Date of Patent: Oct. 5, 2021

(54) WINDOW MOLDING APPARATUS AND METHOD OF MOLDING WINDOW USING THE SAME

(71) Applicant: Samsung Display Co., Ltd., Yongin-si (KR)

(72) Inventors: Hyunseung Seo, Anyang-si (KR); Jonghwan Cho, Ansan-si (KR); Woojin Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 668 days.

(21) Appl. No.: 15/863,085

(22) Filed: Jan. 5, 2018

(65) Prior Publication Data

US 2018/0281251 A1 Oct. 4, 2018

(30) Foreign Application Priority Data

Apr. 4, 2017 (KR) .................. 10-2017-0043845

(51) Int. Cl.

| | |
|---|---|
| B29C 45/26 | (2006.01) |
| B29C 45/03 | (2006.01) |
| H05K 5/00 | (2006.01) |
| H05K 5/03 | (2006.01) |
| B29C 45/00 | (2006.01) |
| B29C 45/33 | (2006.01) |
| B29C 45/44 | (2006.01) |
| B29L 31/00 | (2006.01) |

(52) U.S. Cl.
CPC .......... *B29C 45/26* (2013.01); *B29C 45/0053* (2013.01); *B29C 45/03* (2013.01); *B29C 45/33* (2013.01); *B29C 45/44* (2013.01); *H05K 5/0017* (2013.01); *H05K 5/03* (2013.01); *B29C 2045/338* (2013.01); *B29L 2031/778* (2013.01)

(58) Field of Classification Search
CPC ....................................................... B29C 45/33
See application file for complete search history.

(56) References Cited

U.S. PATENT DOCUMENTS

| | | | |
|---|---|---|---|
| 5,178,815 | A | 1/1993 | Yokote et al. |
| 7,695,270 | B2 | 4/2010 | Roy-Martinache et al. |

(Continued)

FOREIGN PATENT DOCUMENTS

| | | |
|---|---|---|
| CN | 101027173 A | 8/2007 |
| CN | 201559465 U | 8/2010 |

(Continued)

*Primary Examiner* — Monica A Huson
*Assistant Examiner* — Kelsey C Grace
(74) *Attorney, Agent, or Firm* — Lewis Roca Rothgerber Christie LLP

(57) ABSTRACT

A window molding apparatus includes an upper mold, a lower mold under the upper mold, and a side mold under the upper mold and adjacent to at least one side of the lower mold. The upper mold includes a first surface, the lower mold includes a second surface having a portion facing the first surface, and the side mold includes a third surface. The first surface includes a first flat surface and a first bent surface extending from the first flat surface, the second surface includes a second flat surface facing the first flat surface and a second bent surface extending from the second flat surface, and the third surface includes a third bent surface contacting one end of the first bent surface and facing the second bent surface.

18 Claims, 18 Drawing Sheets

(56) References Cited

U.S. PATENT DOCUMENTS

| | | | |
|---|---|---|---|
| 9,271,395 B2* | 2/2016 | Hongo | H05K 1/0283 |
| 2014/0265763 A1* | 9/2014 | Villarreal | H05K 5/0278 |
| | | | 312/223.1 |

FOREIGN PATENT DOCUMENTS

| | | |
|---|---|---|
| CN | 104309063 A | 1/2015 |
| CN | 205969763 U | 2/2017 |
| GB | 2141375 B | 4/1987 |
| JP | 2009-073112 A | 4/2009 |
| KR | 10-1993-0004045 B1 | 5/1993 |
| KR | 10-1276670 B1 | 6/2013 |
| KR | 10-2014-0005553 A | 1/2014 |
| KR | 10-2014-0103547 A | 8/2014 |
| KR | 10-2017-0005918 A | 1/2017 |
| KR | 10-2018-0025429 | 3/2018 |

\* cited by examiner

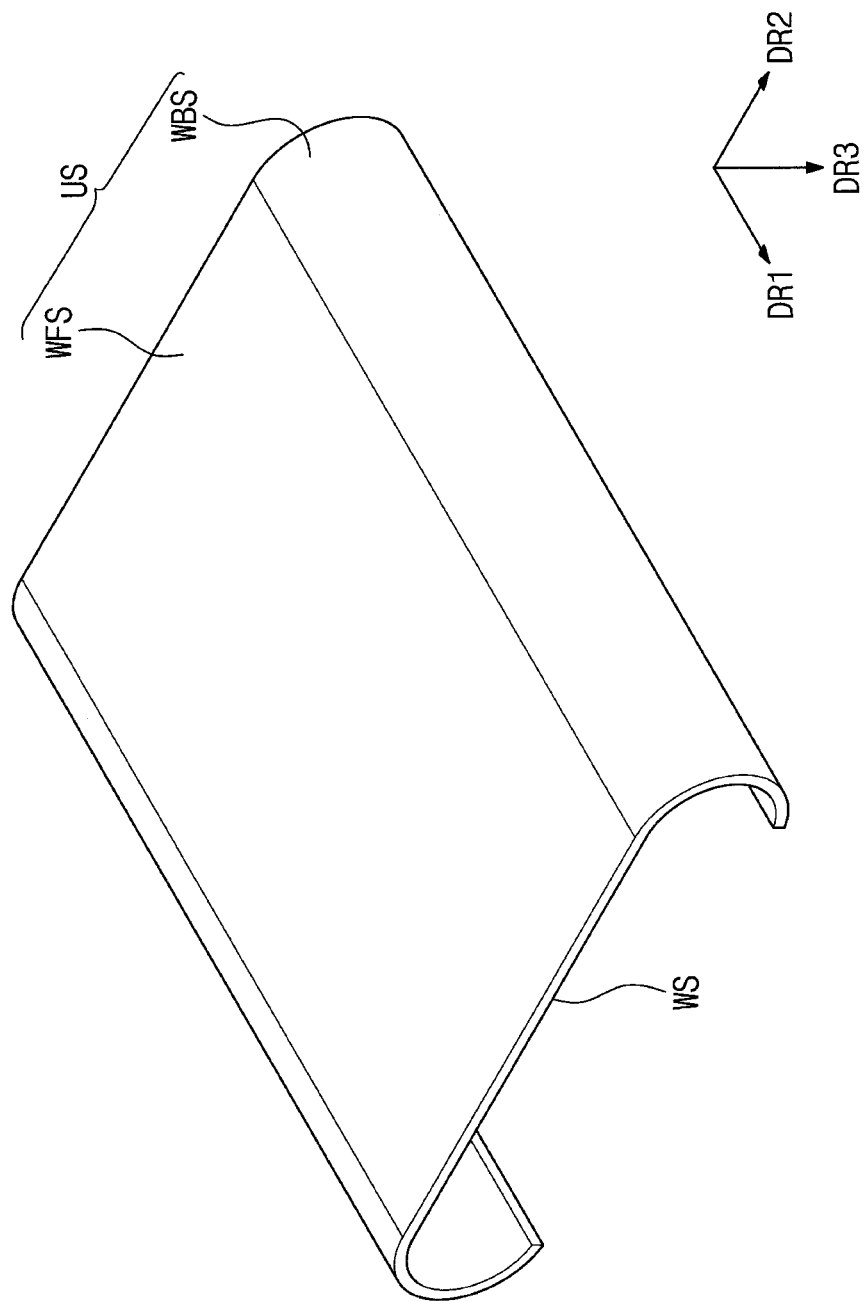

WINDOW MOLDING APPARATUS AND METHOD OF MOLDING WINDOW USING THE SAME

CROSS-REFERENCE TO RELATED APPLICATION

This patent application claims priority to and the benefit of Korean Patent Application No. 10-2017-0043845, filed on Apr. 4, 2017, the content of which is hereby incorporated by reference in its entirety.

BACKGROUND

1. Field

The present disclosure relates to a window molding apparatus and a method of molding a window using the same. More particularly, the present disclosure relates to a window molding apparatus including an upper mold, a lower mold, and a side mold and a method of molding a window using the same.

2. Description of the Related Art

With the recent development of multimedia, various display devices, such as liquid crystal displays (LCDs), organic light emitting displays (OLEDs), etc., have been commercialized.

Screens of the display devices are exposed to the outside to provide visual information like a still image or a moving image to a user. Because a screen is vulnerable to external impacts or scratches, a window cover is attached to the display device to protect the screen of the display device.

Because a lot of display devices with a curved surface have been developed recently, demands for a window having a curved surface corresponding to the curved surface of the display devices are growing.

SUMMARY

The present disclosure provides a window molding apparatus having a curved surface.

The present disclosure provides a method of molding a window having the curved surface.

Embodiments of the present disclosure provide a window molding apparatus including an upper mold including a first surface, a lower mold under the upper mold and including a second surface having a portion facing the first surface, and a side mold under the upper mold and adjacent to at least one side of the lower mold, the side mold including a third surface. The first surface includes a first flat surface and a first bent surface extending from the first flat surface, the second surface includes a second flat surface facing the first flat surface and a second bent surface extending from the second flat surface, and the third surface includes a third bent surface contacting one end of the first bent surface and facing the second bent surface.

Each of the first bent surface, the third bent surface, and the second bent surface is bent with respect to a bending axis extending in a first direction. A first imaginary line connects (or extends) the bending axis to a border between the second flat surface and the second bent surface and a second imaginary line connects (or extends) the bending axis to one end of the second bent surface spaced apart from the second flat surface. A first angle between the first imaginary line and the second imaginary line is greater than about 90 degrees and equal to or less than about 180 degrees.

The first angle is equal to or greater than about 120 degrees and equal to or less than about 180 degrees.

At least a portion of the first bent surface overlaps with at least a portion of the third bent surface when viewed in a plan view.

The side mold includes a rib protruding toward the upper mold from an end of the third bent surface spaced apart from the first bent surface. The rib has a width that decreases in a direction of the upper mold.

The side mold includes a groove recessed from the third bent surface, and the groove is adjacent to an end of the third bent surface spaced apart from the first bent surface. The groove has a width that increases in the direction of the upper mold.

The window molding apparatus further includes driving parts that move the upper mold, the lower mold, and the side mold, respectively. The upper mold moves in an upwards direction or a downwards direction, the lower mold moves in the upwards direction or the downwards direction, and the side mold moves in a sideways direction by the driving parts.

The first bent surface includes a first sub-bent surface extending from one end of the first flat surface and a second sub-bent surface extending from another end of the first flat surface.

The third bent surface includes a third sub-bent surface contacting one end of the first sub-bent surface and a fourth sub-bent surface contacting one end of the second sub-bent surface.

The side mold includes a first sub-mold at one side of the lower mold and comprising the third sub-bent surface and a second sub-mold at another side of the lower mold and comprising the fourth sub-bent surface.

The second bent surface includes a fifth sub-bent surface facing the first sub-bent surface and the third sub-bent surface and a sixth sub-bent surface facing the second sub-bent surface and the fourth sub-bent surface.

The upper mold, the lower mold, and the side mold define an inner space, and a base window including a window bending part and a widow flat part is in the inner space.

Embodiments of the present disclosure provide a window molding method includes injecting a polymer resin into an inner space of a mold, curing the polymer resin to form a base window, cooling the base window, and removing the base window from the mold. The window molding method according to the embodiments of the present disclosure is performed using the window molding apparatus.

According to the above, the window may be easily molded by the window molding apparatus even though the bending angle of the bent surface is large.

The window molding apparatus according to the embodiments of the present disclosure may mold the window so that it is able to be applied to a bezel-less display device.

The window may be easily molded by the window molding method even though the target bending angle is relatively large.

The window molded by the window molding method according to the embodiments of the present disclosure may be applied to the bezel-less display device.

BRIEF DESCRIPTION OF THE DRAWINGS

The above and other features of the present disclosure will become readily apparent by reference to the following detailed description when considered in conjunction with the accompanying drawings wherein:

FIGS. 17 and 18 are perspective views showing a window molded by a window molding method according to an exemplary embodiment of the present disclosure.

DETAILED DESCRIPTION

Figure 1:
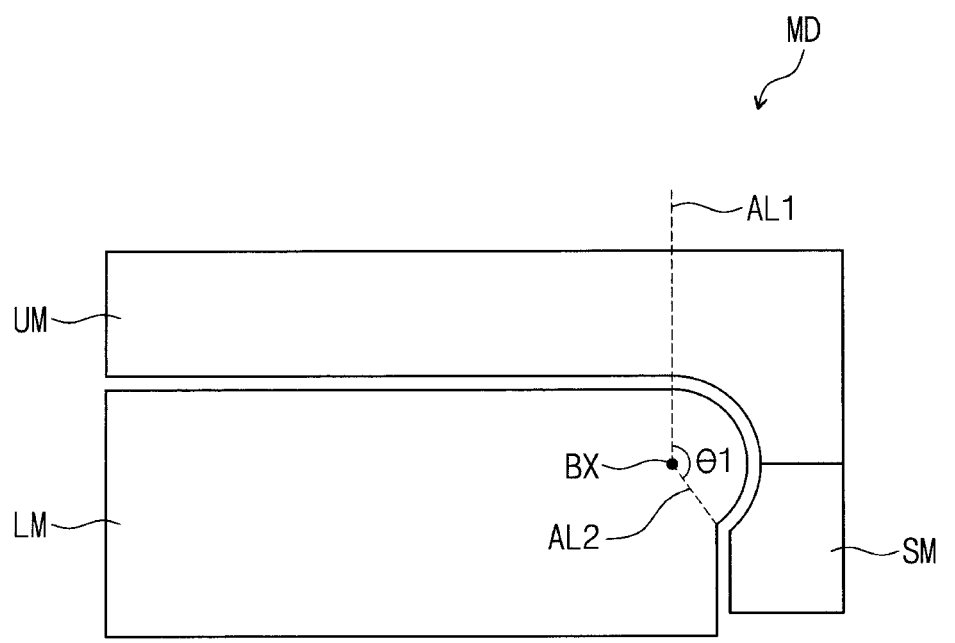
FIG. 1 is a cross-sectional view showing a window molding apparatus according to an exemplary embodiment of the present disclosure.
Figure 1:
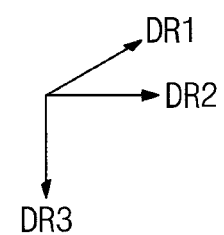

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

Like numbers refer to like elements throughout. In the drawings, the thickness of layers, films, and regions are exaggerated for clarity. As used herein, the term "and/or" includes any and all combinations of one or more of the associated listed items. The use of the terms first, second, etc. do not denote any order or importance, but rather the terms first, second, etc. are used to distinguish one element from another. Thus, a first element, component, region, layer or section discussed below could be termed a second element, component, region, layer or section without departing from the teachings of the present invention. It is to be understood that the singular forms "a," and "an" include plural referents unless the context clearly dictates otherwise.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Hereinafter, the present invention will be explained in detail with reference to the accompanying drawings.

FIG. 1 is a cross-sectional view showing a window molding apparatus MD according to an exemplary embodiment of the present disclosure. In the following descriptions, the term "window molding apparatus" may be referred to as a "mold" according to embodiments.

Referring to FIG. 1, the window molding apparatus MD includes an upper mold UM, a lower mold LM, and a side mold SM. The upper mold UM is provided with an upper surface that is substantially parallel to a surface defined by a first directional axis DR1 and a second directional axis DR2. A third directional axis DR3 indicates a thickness direction of the window molding apparatus MD. In each member, an upper surface (or an upper portion) is distinguished from a lower surface (or a lower portion) by the third directional axis DR3. However, the first to third directional axes DR1 to DR3 are relative to each other, and thus the first to third directional axes DR1 to DR3 may be changed to any other directions. Hereinafter, first to third directions correspond to directions respectively indicated by the first to third directional axes DR1 to DR3, and thus the first to third directions are assigned with the same reference numerals as the first to third directional axes DR1 to DR3.

The lower mold LM is disposed under the upper mold UM. The lower mold LM is disposed adjacent to a lower surface of the upper mold UM. The side mold SM is disposed under the upper mold UM to be adjacent to at least one side of the lower mold LM. A portion of the upper mold UM and a portion of the side mold SM may make contact with each other. The upper mold UM and the lower mold LM may be spaced apart from each other. The side mold SM and the lower mold LM may be spaced apart from each other.

In the present exemplary embodiment, the window molding apparatus MD may be, but is not limited to, a molding apparatus that molds a window in an injection molding method.

Figure 2:
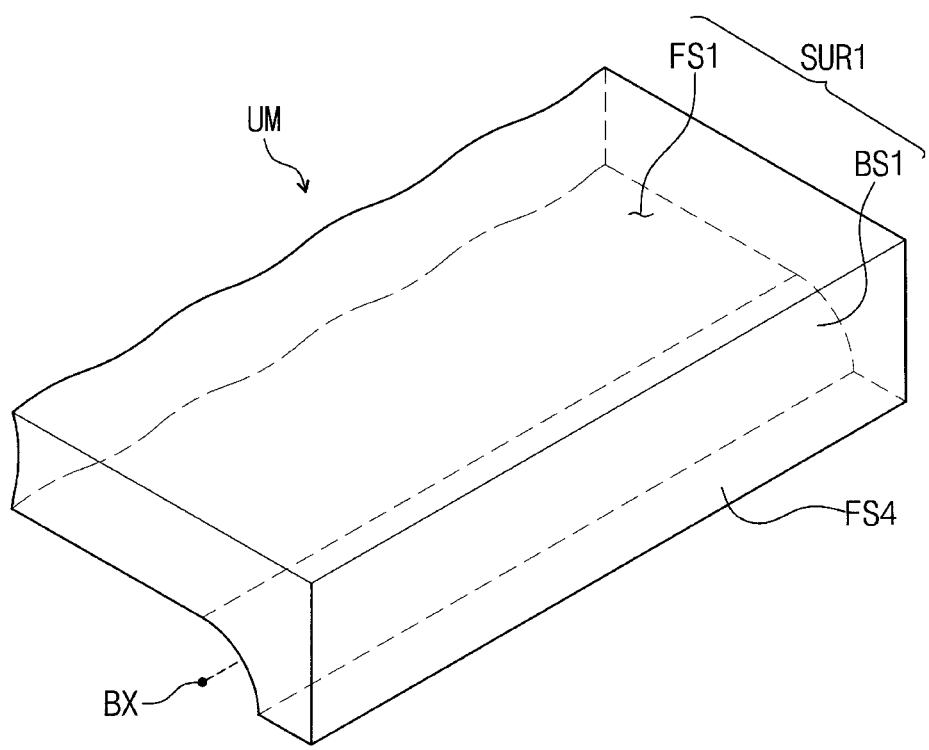
FIG. 2 is a perspective view schematically showing an upper mold included in a window molding apparatus according to an exemplary embodiment of the present disclosure.
Figure 2:
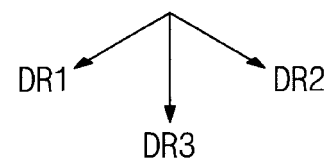
Figure 3:
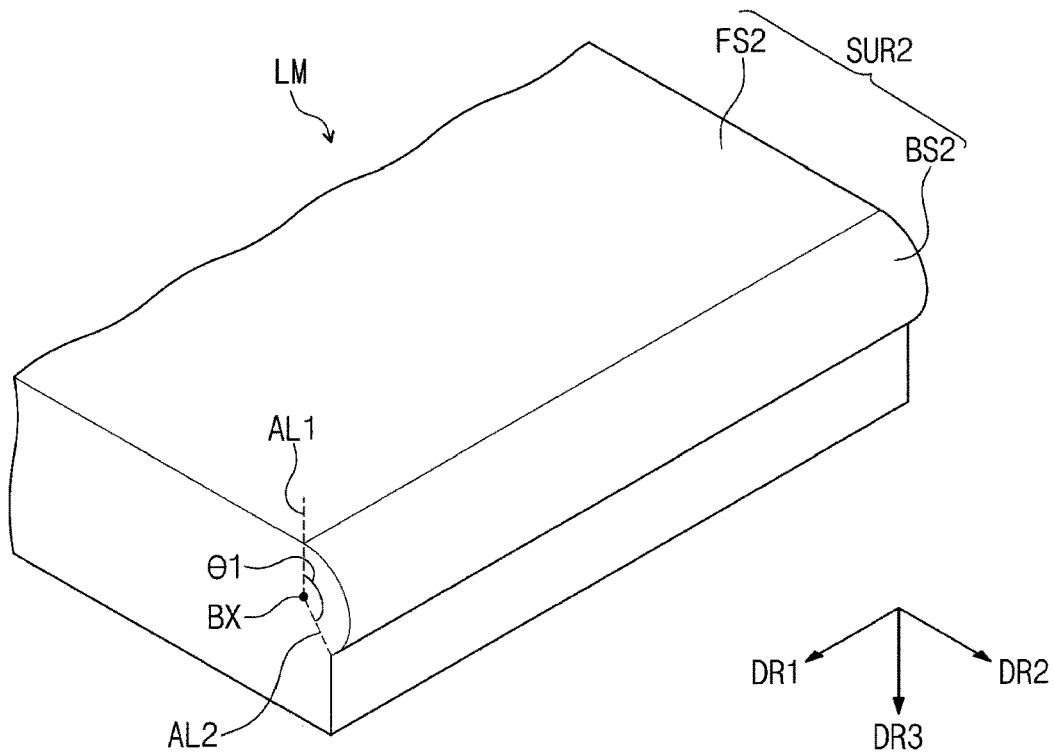
FIG. 3 is a perspective view schematically showing a lower mold included in a window molding apparatus according to an exemplary embodiment of the present disclosure.
Figure 4:
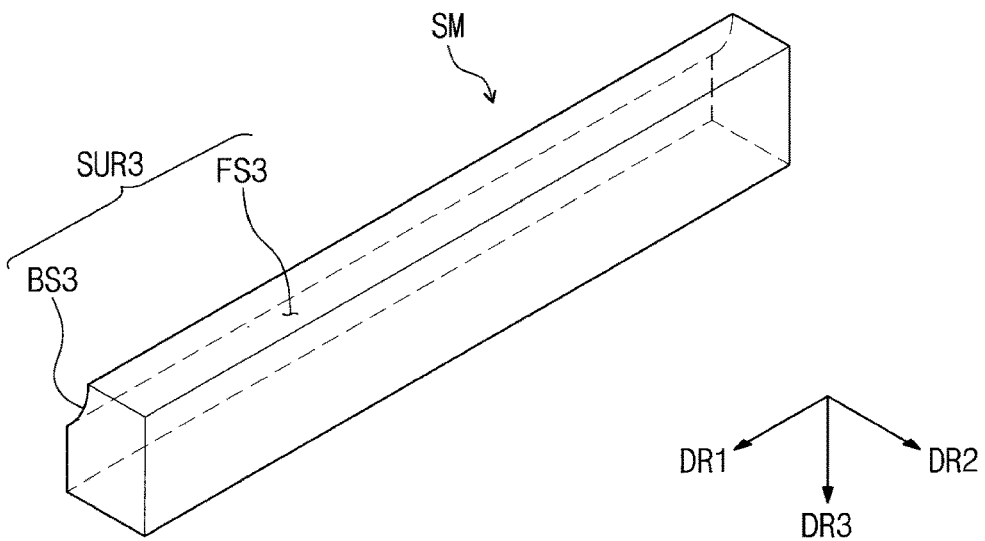
FIG. 4 is a perspective view schematically showing a side mold included in a window molding apparatus according to an exemplary embodiment of the present disclosure.

FIG. 2 is a perspective view schematically showing the upper mold, FIG. 3 is a perspective view schematically showing the lower mold, and FIG. 4 is a perspective view schematically showing the side mold.

Referring to FIGS. 1 to 4, and in particular FIG. 2, the upper mold UM includes a first surface SUR1. The first surface SUR1 includes a first flat surface FS1 and a first bent surface BS1 extending from the first flat surface FS1. In the present disclosure, the term "flat surface" used hereinafter may refer to a surface having no curvature. The lower surface of the upper mold UM includes a fourth flat surface FS4. The fourth flat surface FS4 is substantially parallel to a surface defined by the first directional axis DR1 and the second directional axis DR2. One end of the fourth flat surface FS4 makes contact with one end of the first bent surface BS1.

As shown in FIG. 3, the lower mold LM includes a second surface SUR2. A portion of the second surface SUR2 faces the first surface SUR1. The second surface SUR2 includes a second flat surface FS2 facing the first flat surface FS1 and a second bent surface BS2 extending from the second flat surface FS2. The second flat surface FS2 and the second bent surface BS2 of the lower mold LM define a shape of an inner surface (or a lower surface) of the window molded by the window molding apparatus MD.

As shown in FIG. 4, the side mold SM includes a third surface SUR3. A portion of the third surface SUR3 faces a portion of the second surface SUR2. The third surface SUR3 includes a third bent surface BS3 facing the second bent surface BS2. The third bent surface BS3 makes contact with one end of the first bent surface BS1. The first bent surface BS1 may have the same radius of curvature as the third bent surface BS3, but it should not be limited thereto or thereby. The third surface SUR3 includes a third flat surface FS3 facing the fourth flat surface FS4. One end of the third flat surface FS3 makes contact with one end of the third bent surface BS3. When the mold is arranged to mold the window, the third flat surface FS3 and the fourth flat surface FS4 may make contact with each other. When the mold is separated after molding the window, the third flat surface FS3 and the fourth flat surface FS4 are separated from each other.

The second bent surface BS2 faces the first bent surface BS1 and the third bent surface BS3.

The first flat surface FS1 and the first bent surface BS1 of the upper mold UM and the third bent surface BS3 of the side mold SM define a shape of an outer surface (or an upper surface) of the window molded by the window molding apparatus MD according to the present embodiment.

Each of the first bent surface BS1, the second bent surface BS2, and the third bent surface BS3 is a surface that is bent with respect to a bending axis BX extending in the first direction DR1. The bending axis BX may be defined inside the lower mold LM.

When an imaginary line connecting (or extending between) the bending axis BX and a border between the second flat surface FS2 and the second bent surface BS2 is referred to as a "first imaginary line AL1" and an imaginary line connecting the bending axis BX and one end of the second bent surface BS2 spaced apart from the second flat surface FS2 is referred to as a "second imaginary line AL2", a first angle $\Theta 1$ between the first imaginary line AL1 and the second imaginary line AL2 is greater than about 90 degrees and equal to or less than about 180 degrees, but it should not be limited thereto or thereby. For instance, the first angle $\Theta 1$ may be equal to or greater than about 120 degrees and equal to or less than about 180 degrees. The window molded by the window molding apparatus according to the embodiment of the present disclosure includes a bending portion, and the first angle $\Theta 1$ is substantially the same as a bending angle of the bending portion or a difference between the first angle $\Theta 1$ and the bending angle is not noticeable.

In a case that the first angle $\Theta 1$ is about 180 degrees, the first bent surface BS1 and the third bent surface BS3 make contact with each other to form a hemispherical shape.

A conventional window molding apparatus that is used to mold a window having a bending portion includes an upper mold and a lower mold, and the upper mold and the lower mold are separated from each other in an upper direction (e.g., an upwards direction) and a lower direction (e.g., a downwards direction), respectively, to thereby finally produce the window. However, as a bending angle becomes greater, more particularly, when the bending angle exceeds about 90 degrees, it becomes difficult or impossible to separate the upper mold and the lower mold from each other in the upper and lower directions, respectively, without damaging the window. Therefore, the window molding apparatus MD according to the exemplary embodiment of the present disclosure includes the side mold, which is able to be separated in a side direction (e.g., a left direction or a right direction), and thus the window is easily separated from the window molding apparatus MD although the bending angle becomes greater. Accordingly, it is desirable for the first angle $\Theta 1$ to exceed about 90 degrees in the window molding apparatus MD according to the present embodiment. In other words, it is highly desirable to apply the window molding apparatus MD according to the embodiment of the present disclosure to mold the window having the bending angle greater than about 90 degrees.

When viewed in a plan view, at least a portion of the first bent surface BS1 may overlap with at least a portion of the third bent surface BS3. In this case, the first angle $\Theta 1$ exceeds about 90 degrees. For instance, in a case that the first angle $\Theta 1$ is about 180 degrees, one end of the first bent surface BS1 making contact with the first flat surface FS1 may overlap with one end of the third bent surface BS3 spaced apart from the first bent surface BS1 when viewed in a plan view. In the present disclosure, the term "when viewed in a plan view" used herein may indicate that each element is viewed in the third direction DR3.

Figure 5A:
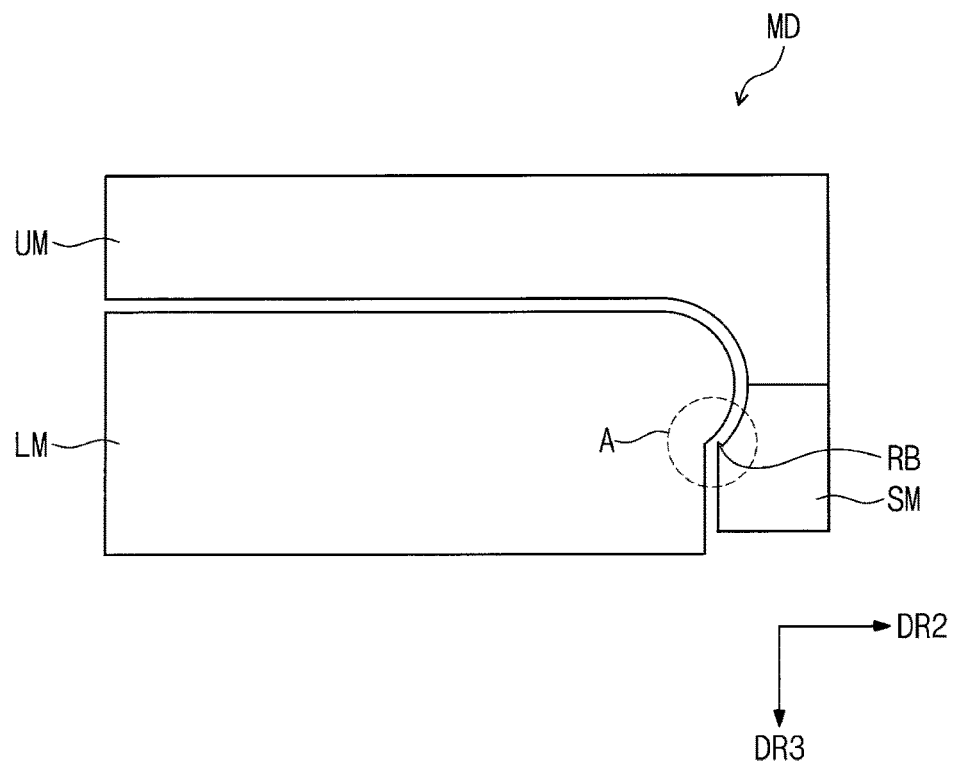
FIG. 5A is a cross-sectional view showing a window molding apparatus according to an exemplary embodiment of the present disclosure.
Figure 5B:
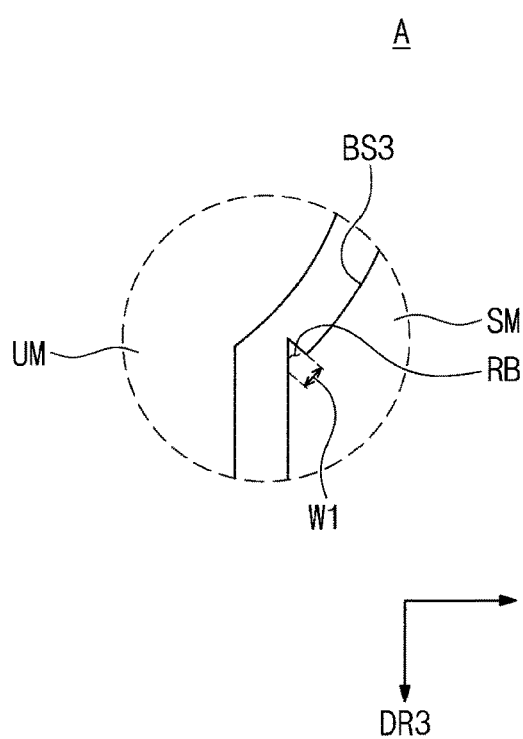
FIG. 5B is an enlarged cross-sectional view showing a portion "A" of FIG. 5A.

FIG. 5A is a cross-sectional view showing a window molding apparatus MD according to an exemplary embodiment of the present disclosure, and FIG. 5B is an enlarged cross-sectional view showing a portion "A" of FIG. 5A.

Referring to FIGS. 2, 5A and 5B, the side mold SM includes a rib RB that is protruded from the third bent surface BS3. The third bent surface BS3 includes one end making contact with the first bent surface BS1 and the other end spaced apart from the first bent surface BS1, and the rib RB is protruded from the other end of the third bent surface BS3 toward the upper mold UM. The rib RB may be provided in singular or plural numbers as needed.

The rib RB has a width W1 that becomes smaller toward the direction of the upper mold UM, but it should not be limited thereto or thereby. The shape of the rib RB should not be limited to that shown in FIGS. 5A and 5B.

In a case that the window is molded using the window molding apparatus MD according to the embodiment of the present disclosure, a cooling process is required to cool a base material of the window after injecting the base material of the window into the window molding apparatus MD and curing the base material of the window. When the cooling process is finished, the window is taken out or removed after the upper mold UM, the lower mold LM, and the side mold SM are separated from each other, but it is difficult to take out the window because the cooled window is attached to the mold. However, because the side mold SM includes the rib RB in the window molding apparatus according to the embodiment of the present disclosure, at least a portion of the window is detached from the mold as the side mold SM is separated, and thus the window is more easily taken out or is taken out with ease. Details on the molding method of the window using the window molding apparatus MD will be described later.

Figure 6A:
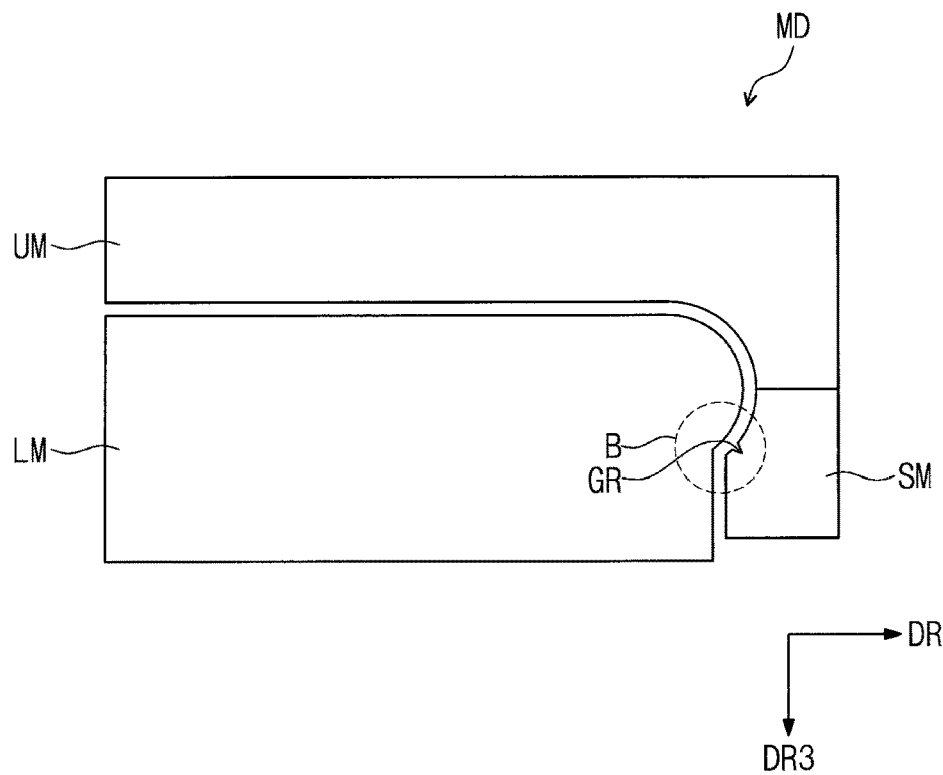
FIG. 6A is a cross-sectional view showing a window molding apparatus according to an exemplary embodiment of the present disclosure.
Figure 6B:
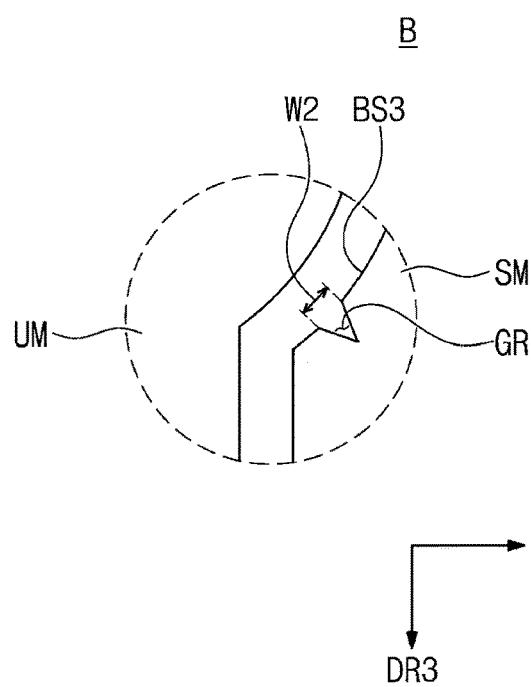
FIG. 6B is an enlarged cross-sectional view showing a portion "B" of FIG. 6A according to one embodiment.
Figure 6C:
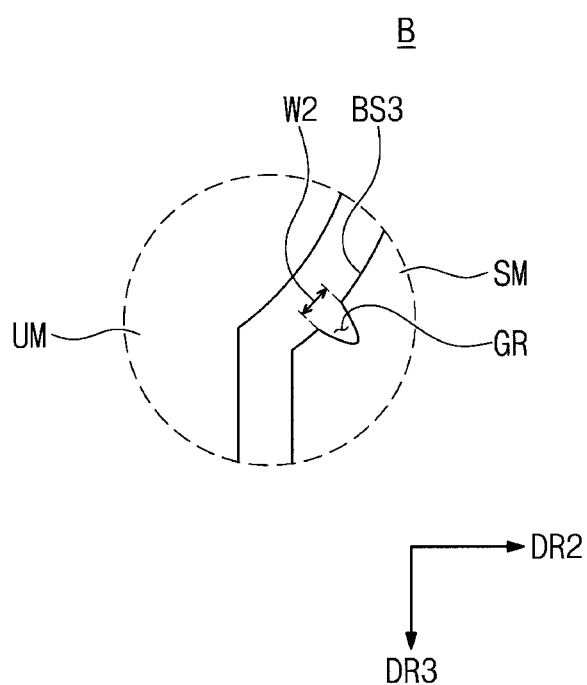
FIG. 6C is an enlarged cross-sectional view showing a portion "B" of FIG. 6A according to another embodiment.

FIG. 6A is a cross-sectional view showing a window molding apparatus MD according to an exemplary embodiment of the present disclosure, FIG. 6B is an enlarged cross-sectional view showing a portion "B" of FIG. 6A according to one embodiment, and FIG. 6C is an enlarged cross-sectional view showing the portion "B" of FIG. 6A according to another embodiment.

Referring to FIGS. 6A, 6B, and 6C, the side mold SM may include a groove GR recessed from the third bent surface BS3. In this case, the base material is filled in the groove GR while the base material is being injected into the window molding apparatus MD, and thus the window includes a protruding portion corresponding to the shape of the groove GR. Because the protruding portion is positioned inside the groove GR of the side mold SM, a portion of the window is pulled out and detached from the second bent surface BS2 when the side mold SM is separated, and as a result, the window is more easily taken out or is taken out with ease. The protruding portion included in the window that is taken out, may be cut and removed easily in a subsequent process.

In order to improve or maximize the effect of the groove GR, it is desirable to form the width W2 of the groove GT to become greater toward the direction of the upper mold UM. In a case that the width W2 of the groove GR is uniform or becomes smaller toward the direction of the upper mold UM, the effect in that the window is easily taken out may not be achieved. As shown in FIGS. 6B and 6C, the shape of the groove GR should not be limited to a specific shape, and the shape of the groove GR may be changed as needed.

Figure 7:
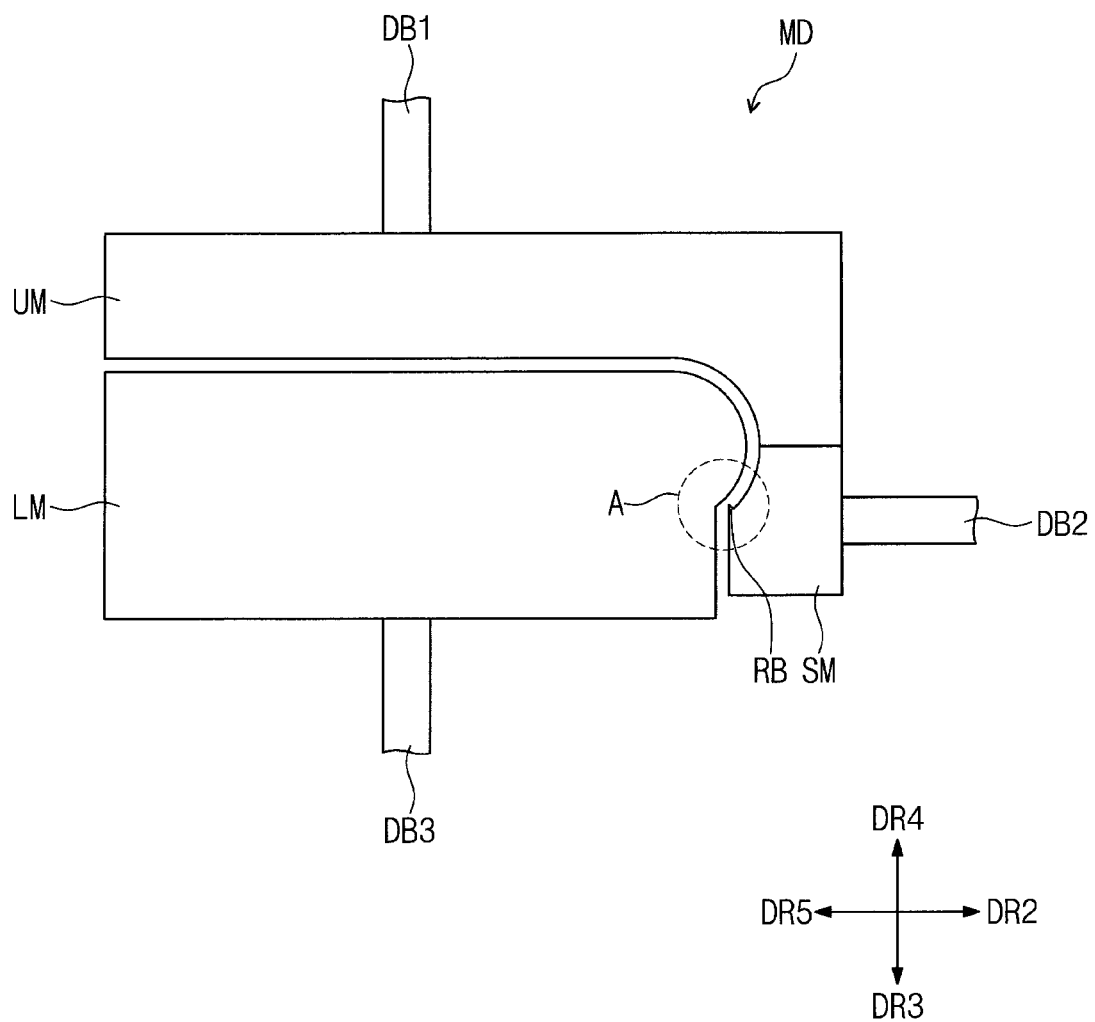
FIG. 7 is a cross-sectional view showing a window molding apparatus according to an exemplary embodiment of the present disclosure.

FIG. 7 is a cross-sectional view showing a window molding apparatus MD according to an exemplary embodiment of the present disclosure.

Referring to FIG. 7, the window molding apparatus MD may further include driving parts DB1, DB2, and DB3 that move the upper mold UM, the lower mold LM, and the side mold SM, respectively. The driving parts DB1, DB2, and DB3 include a first driving part DB1 that moves the upper mold UM, a second driving part DB2 that moves the side mold SM, and a third driving part DB3 that moves the lower mold LM. FIG. 7 shows an example of the driving parts, and a coupling position and a shape of the driving parts should not be limited thereto or thereby.

The upper mold UM moves to an upper direction (e.g., an upwards direction) DR4 or a lower direction (e.g., a downwards direction) DR3 by the first driving part DB1, the side mold SM moves to a side direction (e.g., a sideways direction) DR2 or DR5 by the second driving part DB2, and the lower mold LM moves to the upper direction DR4 or the lower direction DR3 by the third driving part DB3.

When the upper mold UM moves to the upper direction DR4, the lower mold LM may move to the lower direction DR3, and when the upper mold UM moves to the lower direction DR3, the lower mold LM may move to the upper direction DR4. When the upper mold UM moves to the upper direction DR4 and the lower mold LM moves to the lower direction DR3, the side mold SM may move to a direction away from the lower mold LM among the side directions DR2 and DR5. When the upper mold UM moves to the lower direction DR3 and the lower mold LM moves to the upper direction DR4, the side mold SM may move to a direction to be closer to the lower mold LM among the side directions DR2 and DR5.

In the window molding apparatus MD according to the embodiment of the present disclosure, the upper mold UM moves to the upper direction DR4, the lower mold LM moves to the lower direction DR3, and the side mold SM moves to the side direction DR2 or DR5 to be away from the lower mold LM after the window is molded and taken out. Because the side mold SM moves to the side direction DR2 or DR5 without moving in the upper direction DR4 or the lower direction DR3, the window may be easily taken out from the window molding apparatus MD without being damaged even though the window is bent at a relatively large bending angle.

Figure 8:
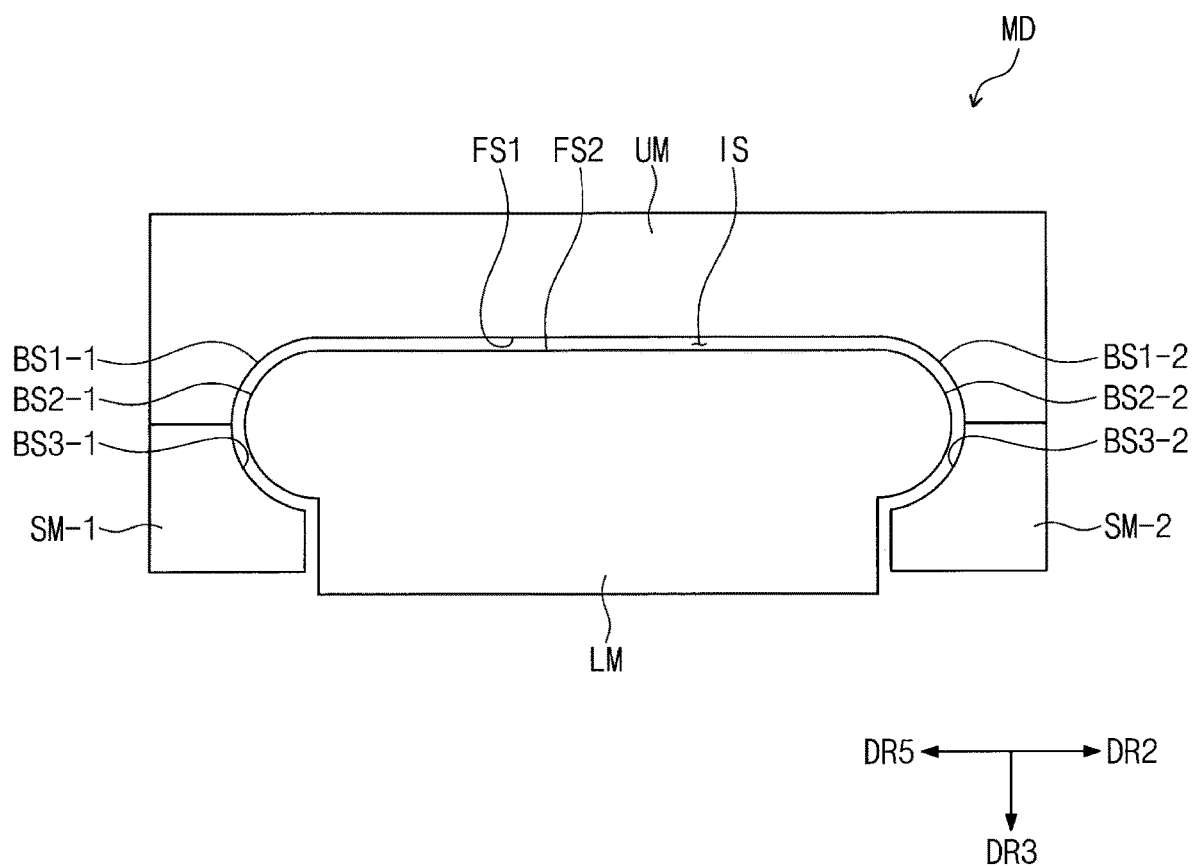
FIG. 8 is a cross-sectional view showing a window molding apparatus according to an exemplary embodiment of the present disclosure.

FIG. 8 is a cross-sectional view showing a window molding apparatus MD according to an exemplary embodiment of the present disclosure.

FIGS. 1 to 7 show the window molding apparatus that is used to mold the window including one bending portion, but the number of the bending portions of the window molding apparatus should not be limited to one. According to the present exemplary embodiment of the present disclosure, the window molding apparatus MD may have a structure that is able to mold a window including a flat portion and two bending portions at both respective ends of the flat portion.

Referring to FIG. 8, a first bent surface BS1-1 and BS1-2 includes a first sub-bent surface BS1-1 extending from one end of a first flat surface FS1 and a second sub-bent surface BS1-2 extending from the other end of the first flat surface FS1. A third bent surface BS3-1 and BS3-2 includes a third sub-bent surface BS3-1 making contact with one end of the first sub-bent surface BS1-1 and a fourth sub-bent surface BS3-2 making contact with one end of the second sub-bent surface BS1-2. The third sub-bent surface BS3-1 makes contact with the one end of the first sub-bent surface BS1-1 spaced apart from the first flat surface FS1, and the fourth sub-bent surface BS3-2 makes contact with the one end of the second sub-bent surface BS1-2 spaced apart from the first flat surface FS1.

A side mold SM-1 and SM-2 includes a first sub-mold SM-1 including the third sub-bent surface BS3-1 and a second sub-mold SM-2 including the fourth sub-bent surface BS3-2. The first sub-mold SM-1 is disposed at one side of the lower mold LM, and the second sub-mold SM-2 is disposed at the other side of the lower mold LM. When the window is taken out from the window molding apparatus MD, for instance, the first sub-mold SM-1 moves to the fifth direction DR5 and the second sub-mold SM-2 moves to the second direction DR2.

A second bent surface BS2-1 and BS2-2 includes a fifth sub-bent surface BS2-1 facing the first sub-bent surface BS1-1 and the third sub-bent surface BS3-1. In addition, the second bent surface BS2-1 and BS2-2 includes a sixth sub-bent surface BS2-2 facing the second sub-bent surface BS1-2 and the fourth sub-bent surface BS3-2.

The first flat surface FS1 and the first to fourth sub-bent surfaces BS1-1, BS1-2, BS3-1, and BS3-2 define a shape of an outer surface (or an upper surface) of the window molded by the window molding apparatus MD according to the present embodiment. The second flat surface FS2, the fifth sub-bent surface BS2-1, and the sixth sub-bent surface BS2-2 define a shape of an inner surface (or a lower surface) of the window molded by the window molding apparatus MD according to the present embodiment.

The upper mold UM, the lower mold LM, and the side mold SM-1 and SM-2 form an inner space IS in which a base window is disposed. The inner space IS has a height corresponding to a thickness of a base finally formed. The height of the inner space IS may correspond to a separation distance between the first flat surface FS1 and the second flat surface FS2 and may correspond to a separation distance between the second bent surface BS2-1 and BS2-2 and each of the first and third bent surfaces BS1-1 and BS1-2 and BS3-1 and BS3-2.

Figure 9:
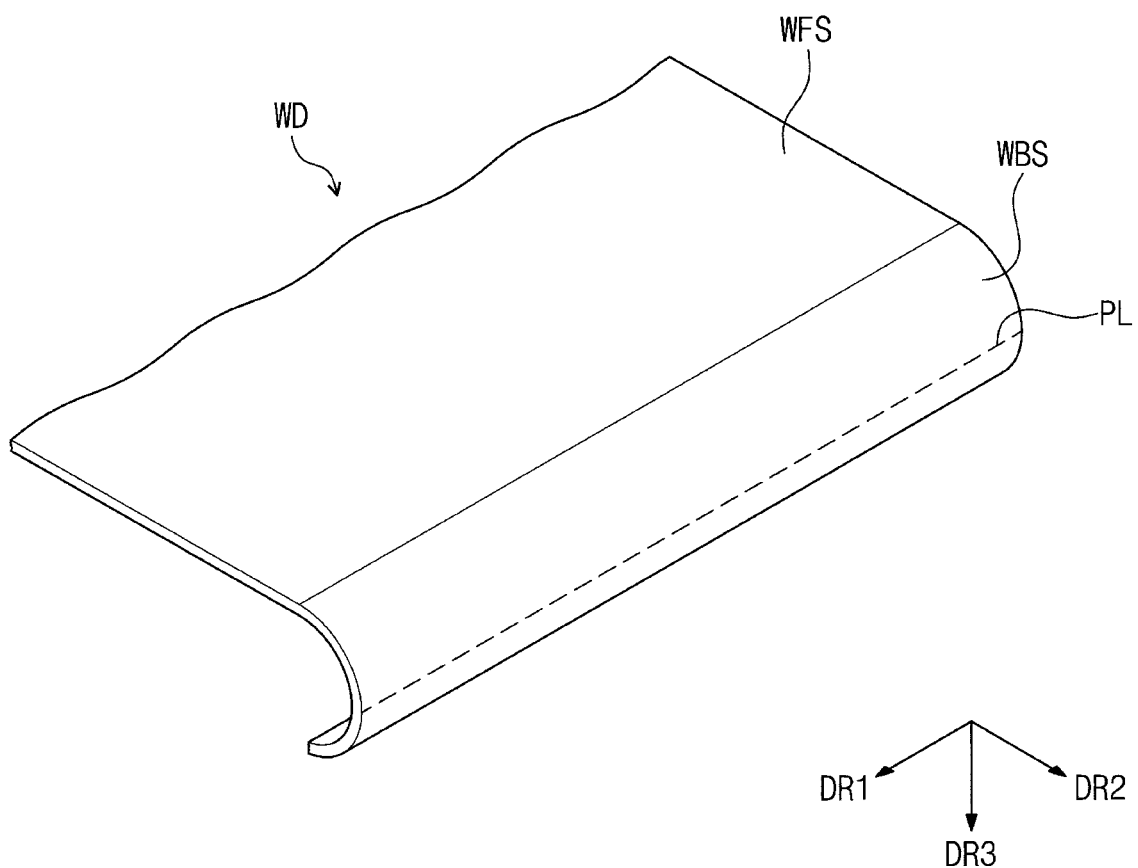
FIG. 9 is a perspective view showing a window molded by a window molding apparatus according to an exemplary embodiment of the present disclosure.

FIG. 9 is a perspective view showing a window WD molded by a window molding apparatus according to an exemplary embodiment of the present disclosure. Referring to FIG. 9, the window WD includes a window flat portion WFS and a window bending portion WBS. Accordingly, a base window may include a window flat portion WFS and a window bending portion WBS. In FIG. 9, the window WD includes one window bending portion WBS, but the number of the window bending portions should not be limited to one. For instance, in the case that the window WD is molded by using the window molding apparatus MD shown in FIG. 8, the window WD may include two window bending portions WBS.

Because the upper surface of the window is molded using the upper mold UM and the side mold SM of the window molding apparatus MD according to the present exemplary embodiment of the present disclosure, a parting-line PL may be formed on the upper surface of the window to correspond to a border between the upper mold UM and the side mold SM. In detail, the parting-line PL may be formed at a portion corresponding to the window bending portion WBS on the upper surface of the window. As the parting-line PL is formed on the upper surface (an outer surface) of the window without being formed on a lower surface (an inner surface) of the window, the parting-line may be easily removed by performing a grinding process on the upper surface of the window in a subsequent process. A structure in which the lower mold is divided into a plurality of parts has been suggested for injection molding of the window having a relatively large bending angle. In this case, however, a plurality of parting-lines is formed on the lower surface (the inner surface) of the window, and they cause difficulties in the grinding process.

Figure 10:
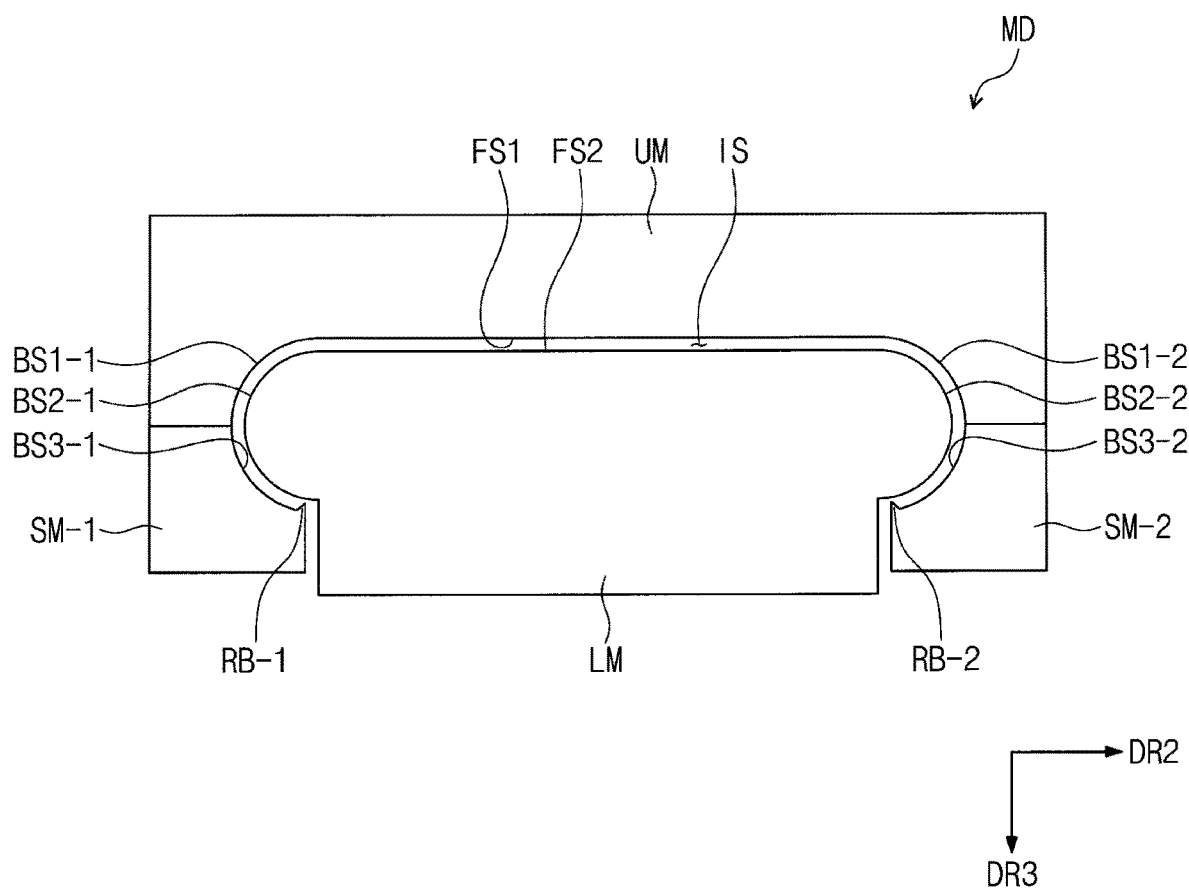
FIG. 10 is a cross-sectional view showing a window molding apparatus according to an exemplary embodiment of the present disclosure.

FIG. 10 is a cross-sectional view showing a window molding apparatus MD according to an exemplary embodiment of the present disclosure.

Referring to FIG. 10, a first sub-mold SM-1 includes a first rib RB-1 protruded from a third sub-bent surface BS3-1, and a second sub-mold SM-2 includes a second rib RB-2 protruded from a fourth sub-bent surface BS3-2. Because portions of the window (e.g., the WD of FIG. 9) are detached from the mold by the first rib RB-1 and the second rib RB-2 when the first sub-mold SM-1 and the second sub-mold SM-2 are separated, the window WD (refer to FIG. 9) may be easily taken out.

Figure 11:
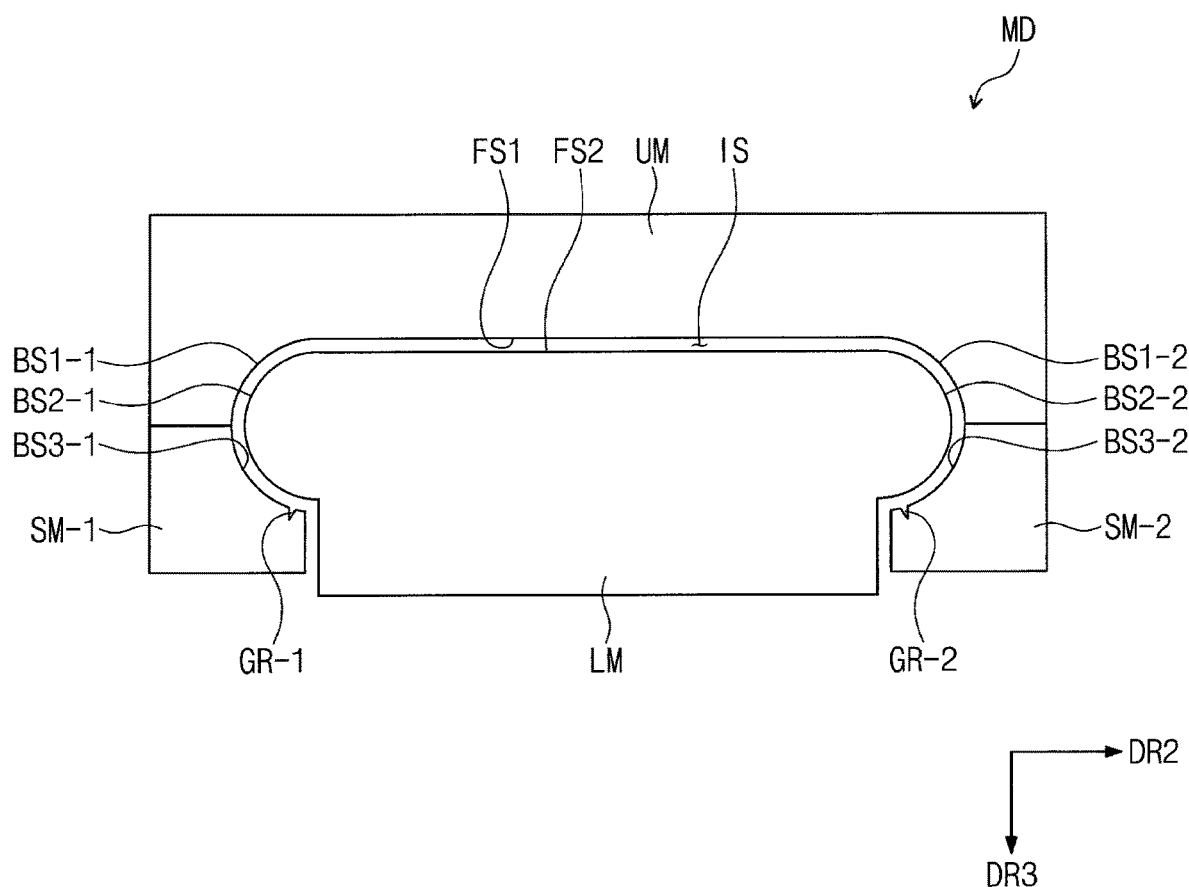
FIG. 11 is a cross-sectional view showing a window molding apparatus according to an exemplary embodiment of the present disclosure.

FIG. 11 is a cross-sectional view showing a window molding apparatus MD according to an exemplary embodiment of the present disclosure.

Referring to FIG. 11, a first sub-mold SM-1 includes a first groove GR-1 recessed from a third sub-bent surface BS3-1, and a second sub-mold SM-2 includes a second groove GR-2 recessed from a fourth sub-bent surface BS3-2. A base material of a window is filled in the first groove GR-1 and the second groove GR-2 and hardened, and the window includes protruding portions respectively corresponding to the first groove GR-1 and the second groove GR-2. Accordingly, the window is pulled away and detached from the second bent surface BS2-1 and BS2-2 and is taken out together with the first sub-mold SM-1 and the second sub-mold SM-2 when the first sub-mold SM-1 and the second sub-mold SM-2 are separated, and thus the window WD (refer to FIG. 9) may be easily taken out. The protruding portions formed in the window that is taken out, may be easily removed by cutting in a subsequent process.

The window molding apparatus MD according to embodiments of the present disclosure is an apparatus that injection-molds the window, and the window molding apparatus MD may be applied to mold the window including a bending portion with a relatively large bending angle. The window molding apparatus MD according to embodiments of the present disclosure includes a side mold that is removed not in an upper or lower direction but in a side direction, and thus the window, having a relatively large bending angle, may be easily taken out from the window molding apparatus MD without being damaged. For example, in a case I which the bending angle exceeds about 90 degrees and a window molding apparatus includes only an upper mold and a lower mold, it is difficult to detach the upper mold and the lower mold after the window is molded. However, the window molding apparatus according to exemplary embodiments of the present disclosure includes the side mold that is separated in the side direction, and thus the bending angle is not limited to a specific angle. Accordingly, the window molding apparatus MD is suitable for forming the window applied to a bezel-less display device. For instance, a window having the bending angle of about 180 degrees may be easily formed, and in this case, a bezel-less structure may be implemented. In addition, because a parting-line is formed not on a lower surface (an inner surface) but on an upper surface (an outer surface) of the window, the parting-line may be easily removed through a subsequent grinding process.

Hereinafter, a method of molding a window according to an exemplary embodiment of the present disclosure will be described with reference to FIGS. 12 to 18. Because the window molding method according to the exemplary embodiments of the present disclosure is performed using the window molding apparatus according to the exemplary embodiments of the present disclosure described earlier, unless otherwise noticed in the following descriptions, the same structure and function of the window molding apparatuses as those in the above-mentioned window molding apparatuses will be omitted in order to avoid redundancy.

Figure 12:
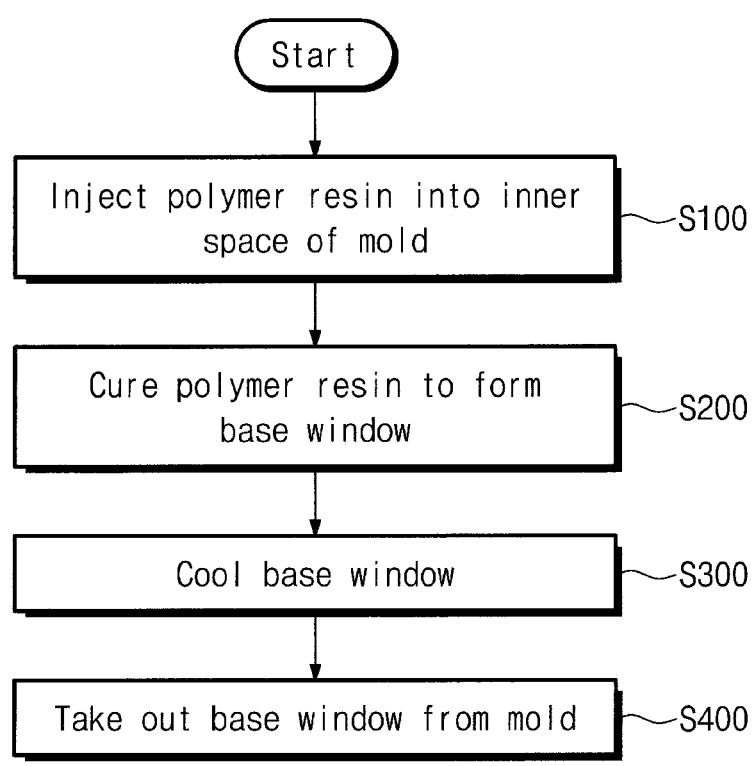
FIG. 12 is a flowchart showing a method of molding a window according to an exemplary embodiment of the present disclosure.

FIG. 12 is a flowchart showing a method of molding a window according to an exemplary embodiment of the present disclosure.

Referring to FIG. 12, the window molding method according to the exemplary embodiment of the present disclosure includes injecting a polymer resin into an inner space of a mold (S100), curing the polymer resin to form a base window (S200), cooling the base window (S300), and taking out the base window from the mold (S400).

Figure 13:
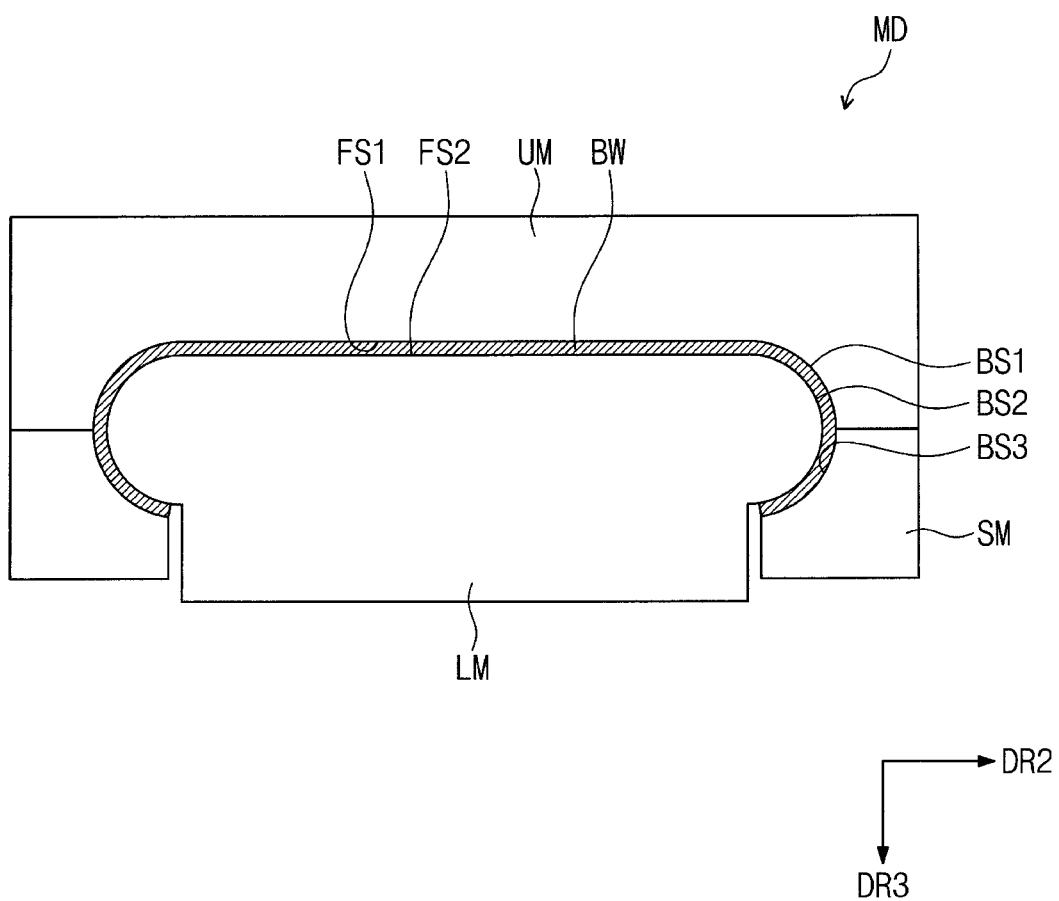
FIG. 13 is a cross-sectional view showing a mold used in a method of molding a window according to an embodiment of the present disclosure.

FIG. 13 is a cross-sectional view showing a mold used in a method of molding a window according to an embodiment of the present disclosure.

FIG. 13 shows a mold used to mold the window including two bending portions, but the number of the bending portions should not be limited to two. As shown in FIG. 1, the window including only one bending portion may be molded. Of course, embodiments according to the present invention may have substantially the same structure as shown in FIG. 1 on the other side as well to fabricate windows having bending portions at both sides.

First, the polymer resin is injected into the inner space of the mold (S100). The window molding apparatus according to the embodiment of the present disclosure is used as the mold. That is, the mold includes the upper mold UM, the lower mold LM disposed under the upper mold UM, and the side mold SM disposed under the upper mold UM to be adjacent to at least one side of the lower mold LM.

The upper mold UM, the lower mold LM, and the side mold SM have the same structure and function as described previously. As an example, the upper mold UM includes a first surface SUR1, and the first surface SUR1 includes a first flat surface FS1 and a first bent surface BS1 extending from the first flat surface FS1. The lower mold LM includes a second surface SUR2, and a portion of the second surface SUR2 faces the first surface SUR1. The second surface SUR2 includes a second flat surface FS2 and a second bent surface BS2 extending from the second flat surface FS2. The side mold SM includes a third surface SUR3. A portion of the third surface SUR3 faces a portion of the second surface SUR2. The third surface SUR3 includes a third bent surface BS3 facing the second bent surface BS2. The third bent surface BS3 makes contact with one end of the first bent surface BS1.

In addition, as described with reference to FIGS. 1 to 4, when an imaginary line is connecting (e.g., extending from) a bending axis BX to a border between the second flat surface FS2 and the second bent surface BS2, referred to as the "first imaginary line AL1", and an imaginary line is connecting (e.g., extending from) the bending axis BX to one end of the second bent surface BS2 spaced apart from the second flat surface FS2, referred to as the "second imaginary line AL2", the first angle Θ1 between the first imaginary line AL1 and the second imaginary line AL2 is greater than about 90 degrees and equal to or less than about 180 degrees. Accordingly, the window having the relatively large bending angle may be molded.

The polymer resin suitable for use herein may be any of those generally known in the art. For instance, a thermoplastic polymer resin may be used, but the polymer resin should not be limited to the thermoplastic polymer resin. The polymer resin may include any one selected from the groups consisting of polycarbonate, cyclo olefin polymer, and polymethylmethacrylate.

Referring to FIGS. 12 and 13, the polymer resin is cured to form the base window BW (S200). In the window molding method according to the exemplary embodiments of the present disclosure, the base window BW, which is an intermediate product, may be formed before the final process is performed. The base window BW, which is cured to have a certain shape, is then cooled (S300).

Figure 14:
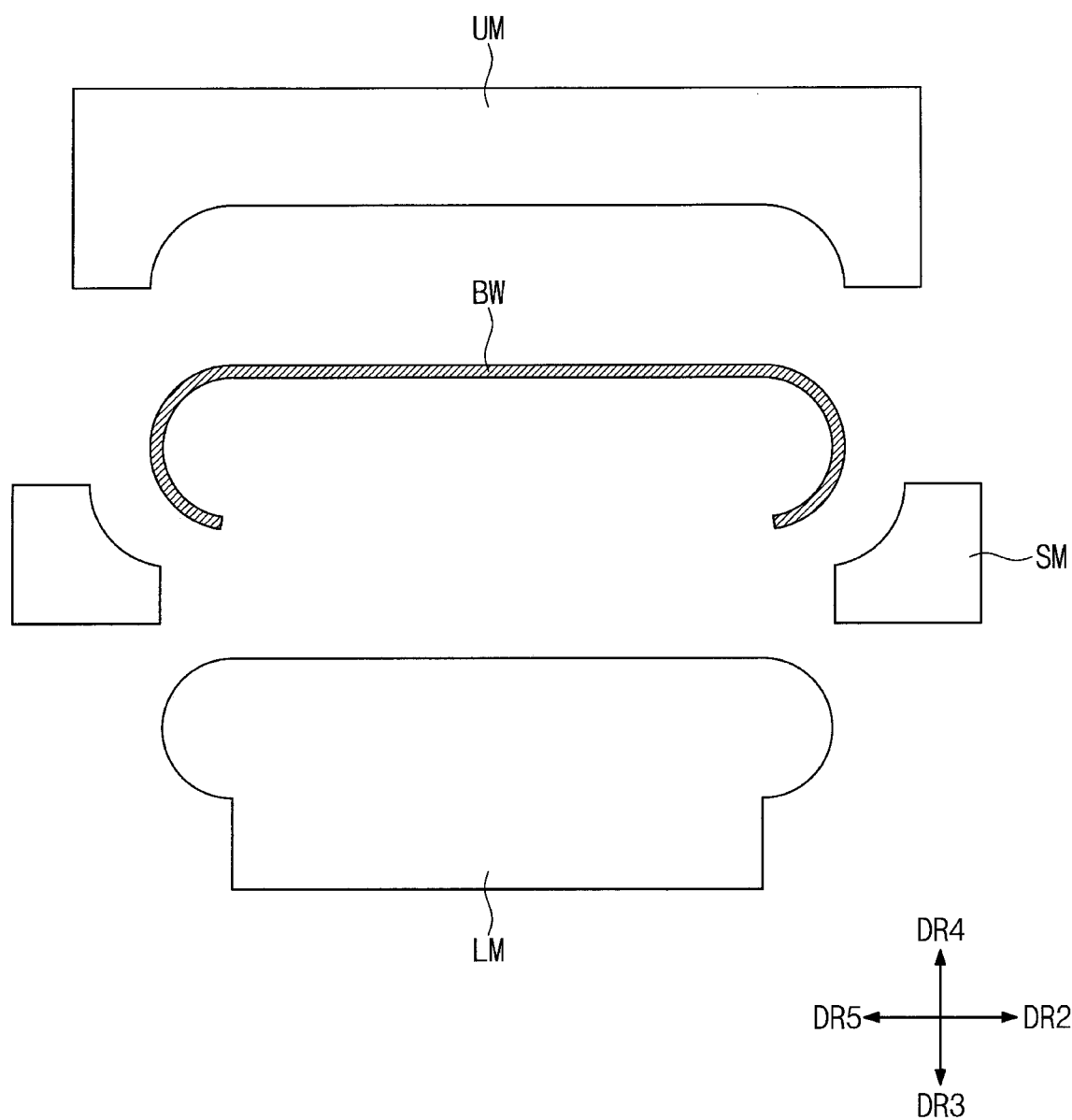
FIG. 14 is a cross-sectional view showing a mold to explain a method of molding a window according to an exemplary embodiment of the present disclosure.

FIG. 14 is a cross-sectional view showing a mold to explain a method of molding a window according to an exemplary embodiment of the present disclosure.

Referring to FIGS. 12 and 14, the base window BW is taken out from the molds UM, SM, and LM (S400). In order to take out the base window BW (S400), the upper mold UM moves to the upper direction DR4 (e.g., in an upwards direction), the lower mold LM moves to the lower direction DR3 (e.g., in a downwards direction), and the side mold SM moves to the side direction DR2 or DR5. As the upper mold UM, the lower mold LM, and the side mold SM move to be separated from each other, the base window BW is taken out concurrently (e.g., simultaneously or at the same time).

Figure 15:
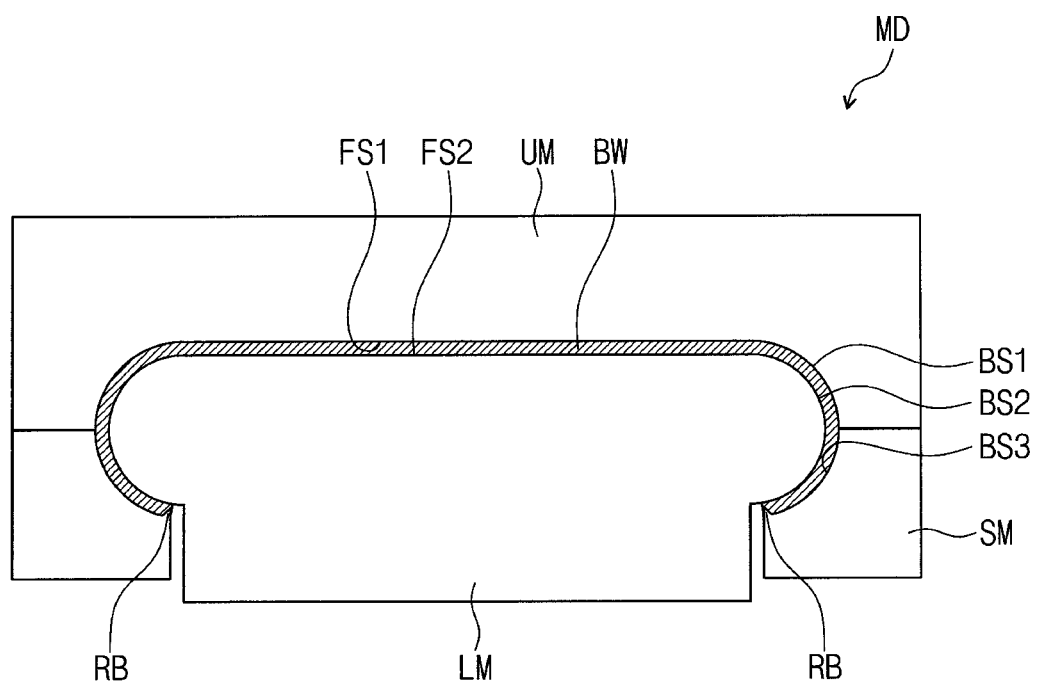
FIG. 15 is a cross-sectional view showing a mold used in a method of molding a window according to an exemplary embodiment of the present disclosure.
Figure 15:
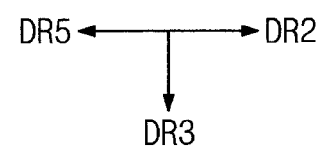
Figure 16:
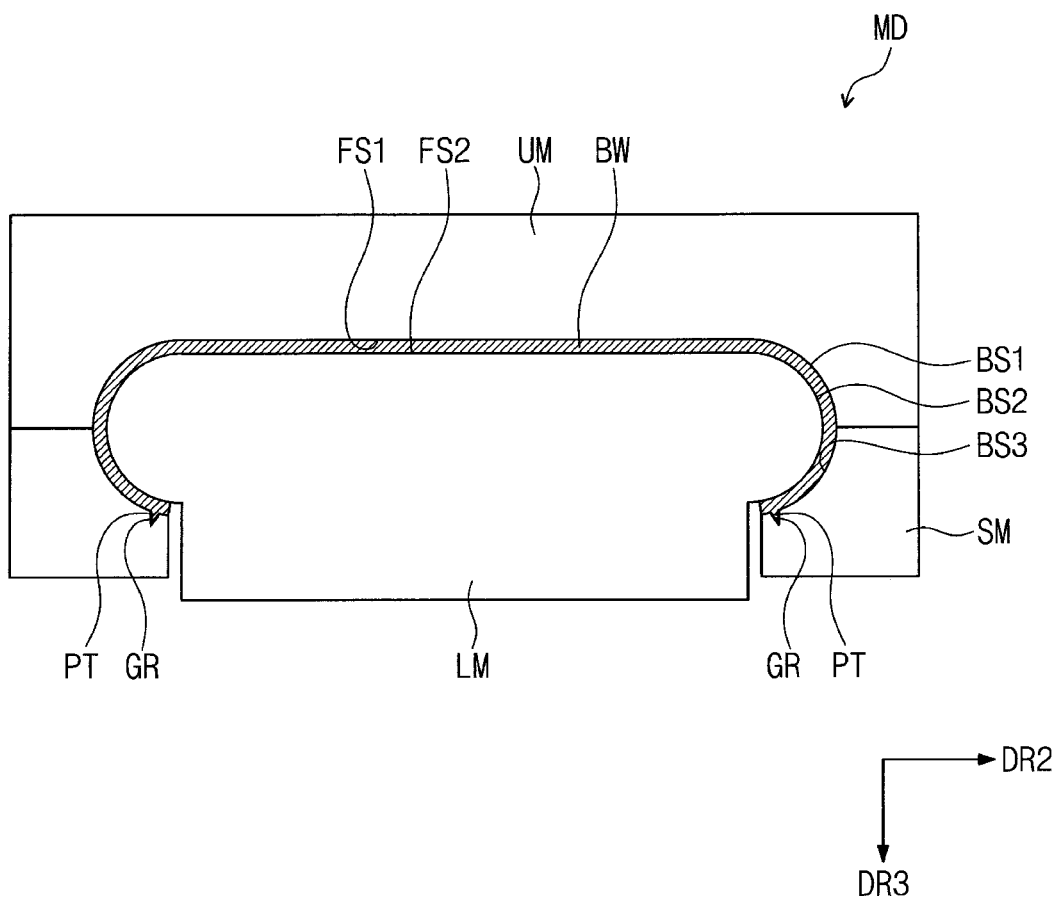
FIG. 16 is a cross-sectional view showing a mold used in a method of molding a window according to an exemplary embodiment of the present disclosure.

As described earlier, it is recommended to include the rib or the groove in the side mold SM to easily take out the base window BW. FIG. 15 is a cross-sectional view showing a mold used in a method of molding a window according to an exemplary embodiment of the present disclosure. FIG. 16 is a cross-sectional view showing a mold used in a method of molding a window according to an exemplary embodiment of the present disclosure. In particular, referring to FIG. 15, a side mold SM may include a rib RB protruded from one end of a third bent surface BS3, which is spaced apart from a first bent surface BS1, toward the upper mold UM. The side mold SM moves to a side direction DR2 or DR5 to be separated, and substantially concurrently or simultaneously, at least a portion of a base window BW is detached from the mold.

As another example, referring to FIG. 16, the side mold SM may include a groove GR recessed from the third bent surface BS3. In this case, the polymer resin is injected into the groove GR during the process of injecting the polymer resin (S100 of FIG. 12) such that the base window BW includes a protruding portion PT corresponding to the groove GR. The process of taking out the base window BW (S400 of FIG. 12) may be a process in which the base window BW is separated from the mold due to the protruding portion PT of the base window BW when the side mold SM moves to the side direction DR2 or DR5.

The method of molding the window according to the embodiment of the present disclosure may further include additional processes as needed, for instance, a process of cutting the protruding portion PT of the base window BW.

Figure 17:
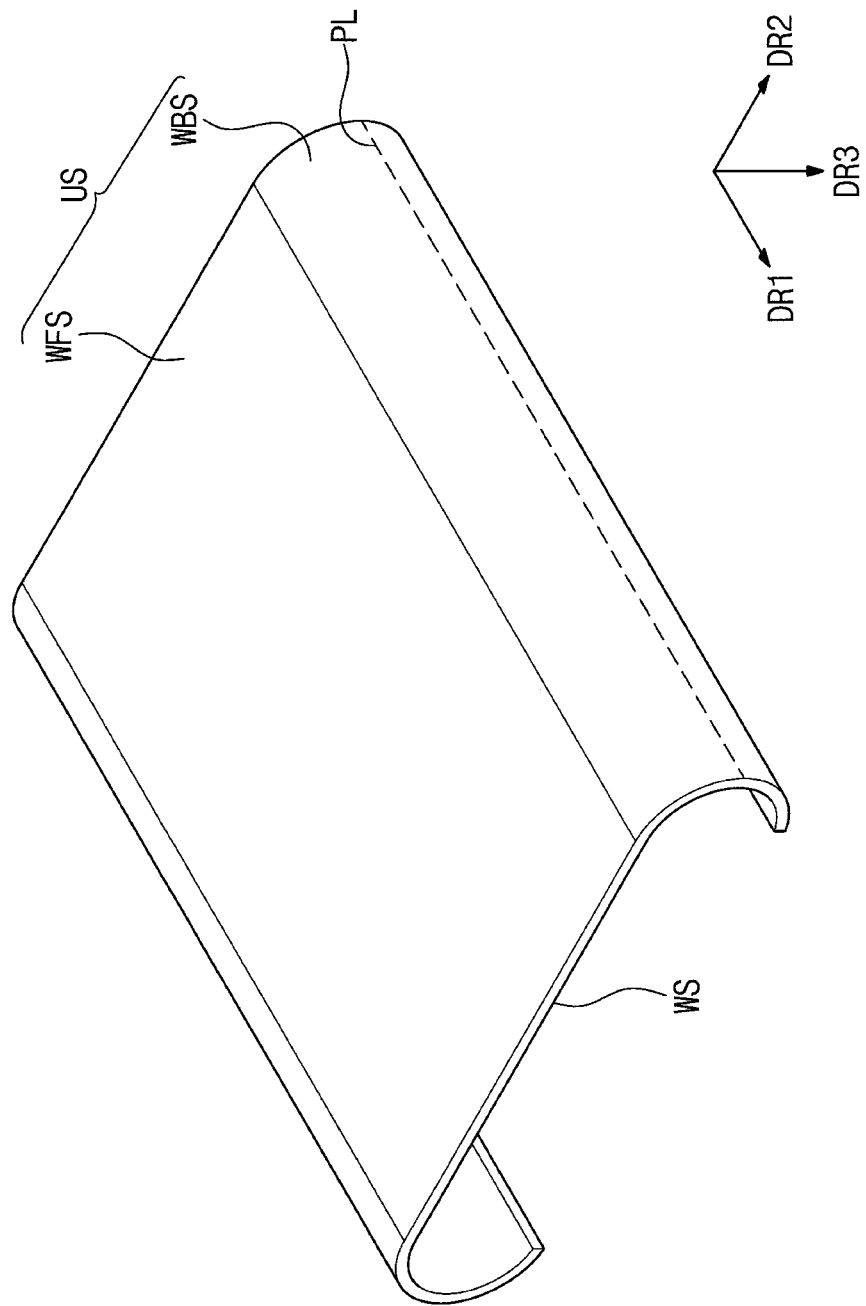

FIGS. 17 and 18 are perspective views showing a window molded by a window molding method according to an exemplary embodiment of the present disclosure.

Referring to FIGS. 12, 13, and 17, the base window BW after the process of taking out the base window BW (S400) includes an upper surface US and a lower surface WS, and the upper surface US includes a window flat surface WFS and a window bent surface WBS connected to the window flat surface WFS. A parting-line PL may be formed on the window bent surface WBS to correspond to a border between the upper mold UM and the side mold SM.

As described above, the method of molding the window according to the embodiment of the present disclosure may further include an additional process, and referring to FIG. 18, a grinding process may be additionally performed to remove the parting-line PL formed on the window bent surface UBS. Because the parting-line PL is formed not on the lower surface WS but on the upper surface US of the base window BW, the grinding process may be relatively easily performed.

The window may be easily molded using the window molding method according to the exemplary embodiment of the present disclosure without limiting the bending angle, and the molded window may be easily taken out from the mold even though the bending angle is relatively large. The window molded using the window molding method according to the exemplary embodiment of the present disclosure may be applied to the bezel-less display device.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed by appended claims and equivalents thereof.

What is claimed is:

1. A window molding apparatus comprising:
   an upper mold having a first surface;
   a lower mold under the upper mold and having a second surface, wherein a portion of the second surface faces the first surface; and
   a side mold under the upper mold and adjacent to at least one side of the lower mold, the side mold having a third surface,
   wherein the first surface comprises a first flat surface and a first bent surface extending from the first flat surface, the second surface comprises a second flat surface facing the first flat surface and a second bent surface extending from the second flat surface, and the third surface comprises a third bent surface facing the second bent surface and wherein a third bent end of the third bent surface contacts a first bent end of the first bent surface; and
   wherein the second bent surface comprises a bent portion facing the first bent end and the third bent end and, in a cross-sectional view perpendicular to the first surface, the bent portion defines an arc, wherein a first imaginary line perpendicular to the instantaneous slope of the arc at one end of the arc and a second imaginary line perpendicular to the instantaneous slope of the arc at the opposite end of the arc intersect at a bending axis and a first angle at the bending axis defining the angular distance of the bent portion is more than about 90 degrees and equal to or less than about 180 degrees.

2. The window molding apparatus of claim 1, wherein the first angle is equal to or greater than about 120 degrees and equal to or less than about 180 degrees.

3. The window molding apparatus of claim 1, wherein at least a portion of the first bent surface overlaps with at least a portion of the third bent surface when viewed in a plan view.

4. The window molding apparatus of claim 1, wherein the side mold comprises a rib protruding toward the upper mold from an end of the third bent surface spaced apart from the first bent surface.

5. The window molding apparatus of claim 4, wherein the rib has a width that decreases in a direction of the upper mold.

6. The window molding apparatus of claim 1, wherein the side mold comprises a groove recessed from the third bent surface, and the groove is adjacent to an end of the third bent surface spaced apart from the first bent surface.

7. The window molding apparatus of claim 6, wherein the groove has a width that increases in a direction of the upper mold.

8. The window molding apparatus of claim 1, further comprising driving parts that move the upper mold, the lower mold, and the side mold, respectively, wherein the upper mold moves in an upwards direction or a downwards direction, the lower mold moves in the upwards direction or the downwards direction, and the side mold moves in a sideways direction by the driving parts.

9. The window molding apparatus of claim 1, wherein the first bent surface comprises:
   a first sub-bent surface extending from one end of the first flat surface; and
   a second sub-bent surface extending from another end of the first flat surface.

10. The window molding apparatus of claim 9, wherein the third bent surface comprises:
    a third sub-bent surface contacting the first bent end of the first sub-bent surface; and
    a fourth sub-bent surface contacting one end of the second sub-bent surface.

11. The window molding apparatus of claim 10, wherein the side mold comprises:
    a first sub-mold at one side of the lower mold and comprising the third sub-bent surface; and
    a second sub-mold at another side of the lower mold and comprising the fourth sub-bent surface.

12. The window molding apparatus of claim 10, wherein the second bent surface comprises:
    a fifth sub-bent surface facing the first sub-bent surface and the third sub-bent surface; and
    a sixth sub-bent surface facing the second sub-bent surface and the fourth sub-bent surface.

13. The window molding apparatus of claim 1, wherein the upper mold, the lower mold, and the side mold define an inner space, and a base window comprising a window bending part and a widow flat part is in the inner space.

14. A method of molding a window, the method comprising:
    injecting a polymer resin into an inner space of a mold;
    curing the polymer resin to form a base window;
    cooling the base window; and
    removing the base window from the mold, wherein the mold comprises:
    an upper mold having a first surface;
    a lower mold under the upper mold and having a second surface, wherein a portion of the second surface faces the first surface; and
    a side mold under the upper mold and adjacent to at least one side of the lower mold, the side mold having a third surface, wherein the first surface comprises a first flat surface and a first bent surface extending from the first flat surface, the second surface comprises a second flat surface facing the first flat surface and a second bent surface extending from the second flat surface, and the third surface comprises a third bent surface facing the second bent surface and wherein a third bent end of the third bent surface contacts a first bent end of the first bent surface; and
    wherein the second bent surface comprises a bent portion facing the first bent end and the third bent end and, in a cross-sectional view perpendicular to the first surface, the bent portion defines an arc, wherein a first imaginary line perpendicular to the instantaneous slope of the arc at one end of the arc and a second imaginary line perpendicular to the instantaneous slope of the arc at the opposite end of the arc intersect at a bending axis and a first angle at the bending axis defining the angular distance of the bent portion is more than about 90 degrees and equal to or less than about 180 degrees.

15. The method of claim 14, wherein removing the base window comprises:
    moving the upper mold in an upwards direction;
    moving the lower mold in a downwards direction; and
    moving the side mold in a sideways direction.

16. The method of claim 15, wherein the side mold comprises a rib protruding in the upwards direction from an end of the third bent surface spaced apart from the first bent surface, and removing the base window comprises separating the base window from the mold by moving the upper mold, the lower mold, and the side mold.

17. The method of claim 15, wherein the side mold comprises a groove recessed from the third bent surface, the groove being adjacent to an end of the third bent surface spaced apart from the first bent surface, and removing the base window comprises separating the base window from the mold by moving the upper mold, the lower mold, and the side mold.

18. The method of claim 14, further comprising a grinding process, wherein an upper surface of the base window comprises an upper flat surface and an upper bent surface extending from the upper flat surface, and the grinding process is performed on the upper bent surface after removing the base window from the mold.

* * * * *